United States Patent
Naito et al.

(10) Patent No.: US 10,277,116 B2
(45) Date of Patent: Apr. 30, 2019

(54) ON-VEHICLE POWER CONVERSION APPARATUS

(71) Applicant: KABUSHIKI KAISHA TOYOTA JIDOSHOKKI, Kariya-shi, Aichi-ken (JP)

(72) Inventors: Atsushi Naito, Kariya (JP); Fumihiro Kagawa, Kariya (JP); Yoshiki Nagata, Kariya (JP); Shunsuke Ambo, Kariya (JP); Keiji Yashiro, Kariya (JP); Kazuhiro Shiraishi, Kariya (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 0 days.

(21) Appl. No.: 16/088,326

(22) PCT Filed: Mar. 30, 2017

(86) PCT No.: PCT/JP2017/013144
§ 371 (c)(1),
(2) Date: Sep. 25, 2018

(87) PCT Pub. No.: WO2017/170818
PCT Pub. Date: Oct. 5, 2017

(65) Prior Publication Data
US 2019/0089243 A1 Mar. 21, 2019

(30) Foreign Application Priority Data
Mar. 31, 2016 (JP) ................................ 2016-072923

(51) Int. Cl.
H03M 1/44 (2006.01)
H02M 1/44 (2007.01)
(Continued)

(52) U.S. Cl.
CPC .............. *H02M 1/44* (2013.01); *H02M 1/143* (2013.01); *H02M 7/003* (2013.01); *H02M 7/537* (2013.01)

(58) Field of Classification Search
CPC ........ H02M 1/44; H02M 7/537; H02M 7/003; H02M 1/143
See application file for complete search history.

(56) References Cited

U.S. PATENT DOCUMENTS

| 8,777,585 | B2 | 7/2014 | Nakano et al. |
| 2013/0010434 | A1* | 1/2013 | Kojima .................. H01F 19/04 361/748 |

(Continued)

FOREIGN PATENT DOCUMENTS

| JP | 03-286511 A | 12/1991 |
| JP | 06-069680 A | 3/1994 |

(Continued)

OTHER PUBLICATIONS

International Search Report for PCT/JP2017/013144 dated May 23, 2017.

(Continued)

*Primary Examiner* — Kyle J Moody
(74) *Attorney, Agent, or Firm* — Sughrue Mion, PLLC

(57) ABSTRACT

This on-vehicle power conversion apparatus is provided with: a power conversion circuit to which DC power is inputted; and a noise reduction unit that is configured to reduce common-mode noise and normal-mode noise which are included in the DC power and that is provided to the input side of the power conversion circuit. The noise reduction unit is provided with: a core having a first core part and a second core part; a common-mode chalk coil having a first winding wire wound around the first core part and a second winding wire wound around the second coil part; and a smoothing capacitor that constitutes a low-pass filter circuit (Continued)

cooperatively with the common-mode chalk coil. The power conversion apparatus is further provided with a damping unit provided at a position intersecting the magnetic path of a magnetic flux leakage.

8 Claims, 11 Drawing Sheets

(51) Int. Cl.
*H02M 7/00* (2006.01)
*H02M 1/14* (2006.01)
*H02M 7/537* (2006.01)

(56) References Cited

U.S. PATENT DOCUMENTS

2017/0288512 A1* 10/2017 Kagawa ................. H02K 11/33
2018/0194200 A1* 7/2018 Ambo ................... B60H 1/3223
2018/0198350 A1* 7/2018 Ambo ..................... H02K 11/02

FOREIGN PATENT DOCUMENTS

| JP | 07-066041 A | 3/1995 |
| JP | 2000-166254 A | 6/2000 |
| JP | 2006-180578 A | 7/2006 |
| JP | 2012-120348 A | 6/2012 |
| JP | 5039515 B2 | 10/2012 |
| JP | 2015-033143 A | 2/2015 |
| JP | 2015-112965 A | 6/2015 |
| JP | 2015-220885 A | 12/2015 |

OTHER PUBLICATIONS

International Preliminary Report on Patentability with the translation of Written Opinion dated Oct. 2, 2018 issued by the International Bureau in PCT/JP2017/013144.

* cited by examiner

ON-VEHICLE POWER CONVERSION APPARATUS

CROSS REFERENCE TO RELATED APPLICATIONS

This application is a National Stage of International Application No. PCT/JP2017/013144 filed Mar. 30, 2017, claiming priority based on Japanese Patent Application No. 2016-072926 filed Mar. 31, 2016.

TECHNICAL FIELD

The present invention relates to an on-board power conversion device (a power conversion device configured to be installed in a vehicle).

BACKGROUND ART

An on-board power conversion device into which direct current power is input is known in the prior art (for example, refer to patent document 1). The on-board power conversion device is used to drive an electric motor mounted on a vehicle.

PRIOR ART DOCUMENT

Patent Document

Patent Document 1: Japanese Laid-Open Patent Publication No. 2015-033143

SUMMARY OF THE INVENTION

Problems that are to be Solved by the Invention

Direct current power may contain both common-mode noise and normal-mode noise before being input to an on-board power conversion device. In this case, the noises may hinder the on-board power conversion device from performing a normal power conversion. In particular, frequencies of normal-mode noise vary depending on types of vehicle on which an on-board power conversion device is mounted. Thus, a wide frequency band of normal-mode noise needs to be reduced from the viewpoint of versatility, that is, from the viewpoint of applicability to many types of vehicles. However, enlargement of an on-board power conversion device is not preferred from the viewpoint of mounting on a vehicle.

It is an object of the present invention to provide an on-board power conversion device that reduces common-mode noise and normal-mode noise contained in direct current power in a preferred manner.

Means for Solving the Problem

To achieve the above object, an on-board power conversion device includes a power conversion circuit to which direct current power is input and a noise reducer arranged at an input side of the power conversion circuit and configured to reduce common-mode noise and normal-mode noise contained in the direct current power before the direct current power is input to the power conversion circuit. The noise reducer includes a common-mode choke coil including a core having a first core portion and a second core portion, a first winding wound around the first core portion, and a second winding wound around the second core portion and a smoothing capacitor cooperating with the common-mode choke coil to configure a low-pass filter circuit. The power conversion device further includes a damping portion located at a position intersecting with a magnetic path of a leakage flux produced from the common-mode choke coil. The damping portion is configured to produce an eddy current with the leakage flux to lower a Q factor of the low-pass filter circuit.

With this configuration, the common-mode choke coil reduces common-mode noise contained in direct current power that is the conversion subject. When a normal-mode current flows, the common-mode choke coil produces a leakage flux. Thus, normal-mode noise is reduced with the low-pass filter configured by the common-mode choke coil and the smoothing capacitor. This dispenses with a dedicated coil that reduces normal-mode noise and limits enlargement of the on-board power conversion device.

In particular, with this configuration, the Q factor of the low-pass filter circuit is lowered by the damping portion. Thus, the noise reducer reduces normal-mode noise having frequencies close to the resonance frequency of the low-pass filter circuit. This allows the noise reducer to reduce a wider frequency band of normal-mode noise and contributes to improvement of the versatility. The damping portion, which is located at a position intersecting with a magnetic path of a leakage flux to produce an eddy current with the leakage flux, allows a low current to flow and does not easily generate heat as compared to, for example, a damping resistor connected in series to the common-mode choke coil. This facilitates miniaturization of the on-board power conversion device as compared to, for example, a configuration in which a damping resistor is used. Thus, while limiting enlargement of the on-board power conversion device and reducing both common-mode noise and normal-mode noise, the versatility may be improved.

Preferably, in the on-board power conversion device described above, the damping portion covers at least a portion of a side surface of the common-mode choke coil. With this configuration, the damping portion covers at least part of the side surface of the common-mode choke coil. Thus, the damping portion functions as magnetic resistance that lowers the Q factor. The Q factor of the low-pass filter circuit is lowered with the relatively simple configuration.

Preferably, the on-board power conversion device described above further includes a circuit board including a pattern wire and a case accommodating the power conversion circuit, the circuit board, and the noise reducer. The damping portion is shaped as a box having an opening covered by the case. The common-mode choke coil is accommodated in an accommodation space defined by the dumping portion and the case. With this configuration, the damping portion covers surfaces of the common-mode choke coil other than the opening side surface. Additionally, when the opening of the damping portion is covered with a case, the case functions to lower the Q factor of the low-pass filter circuit.

Preferably, in the on-board power conversion device described above, the damping portion includes a shielding electro-conductive metal film that covers at least a portion of the common-mode choke coil.

Preferably, the on-board power conversion device described above includes a circuit board including a pattern wire. The damping portion includes a shielding electro-conductive metal case having an opening and a shielding electro-conductive metal film located on the circuit board in a region inward from the opening. The common-mode choke coil is accommodated in the shielding electro-conductive metal case through the opening. The shielding electro-conductive metal case is fixed to the circuit board so that the opening is closed with the circuit board. Further, preferably, the shielding electro-conductive metal film is a shielding pattern conductive body.

Effect of the Invention

According to the present invention, common-mode noise and normal-mode noise contained in direct current power are reduced in a preferred manner.

EMBODIMENTS OF THE INVENTION

First Embodiment

One embodiment of an on-board inverter, which corresponds to an on-board power conversion device, will now be described. In other words, in the present embodiment, a power conversion device is an inverter that converts direct current power to alternating current power.

Figure 1:
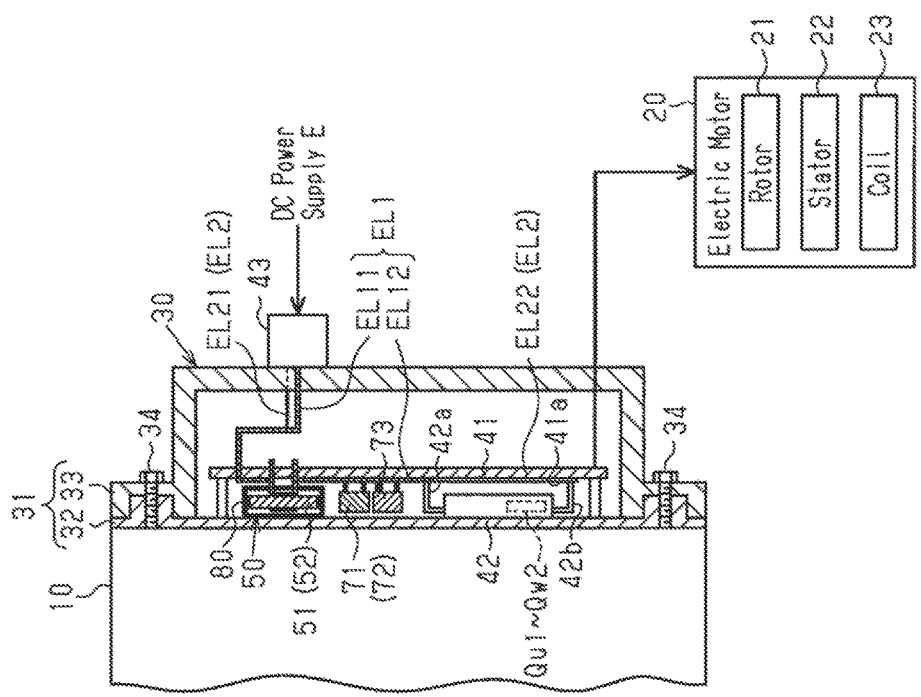
FIG. 1 is a partially cutaway view schematically showing a first embodiment of an on-board inverter.

As shown in FIG. 1, an on-board inverter 30 is in contact with a heatsink 10. The heatsink 10 is grounded to a body of a vehicle. The on-board inverter 30 drives an electric motor 20 mounted on the vehicle.

The electric motor 20 includes a rotor 21, a stator 22, and a coil 23 wound around the stator 22. Energization of the coil 23 rotates the rotor 21 and drives the electric motor 20. A drive current of the electric motor 20 is higher than, for example, current of signals and is, for example, higher than or equal to 10 A, preferably, higher than or equal to 20 A.

The on-board inverter 30 includes an inverter case 31 accommodating various components such as a circuit board 41, a power module 42, and a noise reducer 50. The inverter case 31 is formed by a thermal-conductive, electro-conductive, non-magnetic material (e.g., metal such as aluminum). The inverter case 31 corresponds to a "case."

The inverter case 31 includes a plate-shaped base member 32, which is in contact with the heatsink 10, and a tubular cover member 33 coupled to the base member 32. The cover member 33 has an opening and a wall end. The base member 32 and the cover member 33 are fastened to the heatsink 10 with bolts 34 serving as fasteners.

Since the inverter case 31 and the heatsink 10 are in contact with each other, the inverter case 31 and the heatsink 10 are thermally connected to each other. The on-board inverter 30 is located on a position thermally connected to the heatsink 10.

The on-board inverter 30 includes, for example, the circuit board 41 fixed to the base member 32 and the power module 42 mounted on the circuit board 41. The circuit board 41 is opposed to the base member 32 and spaced apart by a predetermined gap in the thickness-wise direction of the base member 32 and includes a board surface 41a opposed to the base member 32. The board surface 41a is a surface on which the power module 42 is mounted.

The power module 42 includes an output portion electrically connected to the coil 23 of the electric motor 20. The power module 42 includes a plurality of switching elements Qu1, Qu2, Qv1, Qv2, Qw1, and Qw2 (hereinafter, may be simply referred to as switching elements Qu1 to Qw2). In the present embodiment, the power module 42 corresponds to a "power conversion circuit."

The inverter case 31 (more specifically, cover member 33) includes a connector 43. Direct current power is supplied from a DC power supply E mounted on the vehicle to the on-board inverter 30 through the connector 43. The vehicle includes a power supply capacitor C0, which is connected in parallel to the DC power supply E (refer to FIG. 5). The power supply capacitor C0 includes, for example, a film capacitor.

The on-board inverter 30 includes two wires EL1 and EL2, which electrically connect the connector 43 to an input portion of the power module 42. A first wire EL1 is connected via the connector 43 to a + terminal (positive terminal) of the DC power supply E and to a first module input terminal 42a, that is, a first input terminal of the power module 42. The second wire EL2 is connected via the connector 43 to a − terminal (negative terminal) of the DC power supply E and to a second module input terminal 42b, that is, a second input terminal of the power module 42. With direct current power supplied to the power module 42 through the two wires EL1 and EL2, when the switching elements Qu1 to Qw2 are cyclically switched on and off, the on-board inverter 30 converts the direct current power into alternating current power and supplies the alternating current power to the coil 23 of the electric motor 20. As a result, the electric motor 20 is driven.

Current (i.e., power) handled by the on-board inverter 30 is large enough to drive the electric motor 20 and thus is greater than, for example, current (i.e., power) of a signal. The current handled by the on-board inverter 30 is, for example, higher than or equal to 10 A, preferably, higher than or equal to 20 A. The DC power supply E is, for example, an on-board power storage device such as a rechargeable battery or a capacitor.

Figure 2:
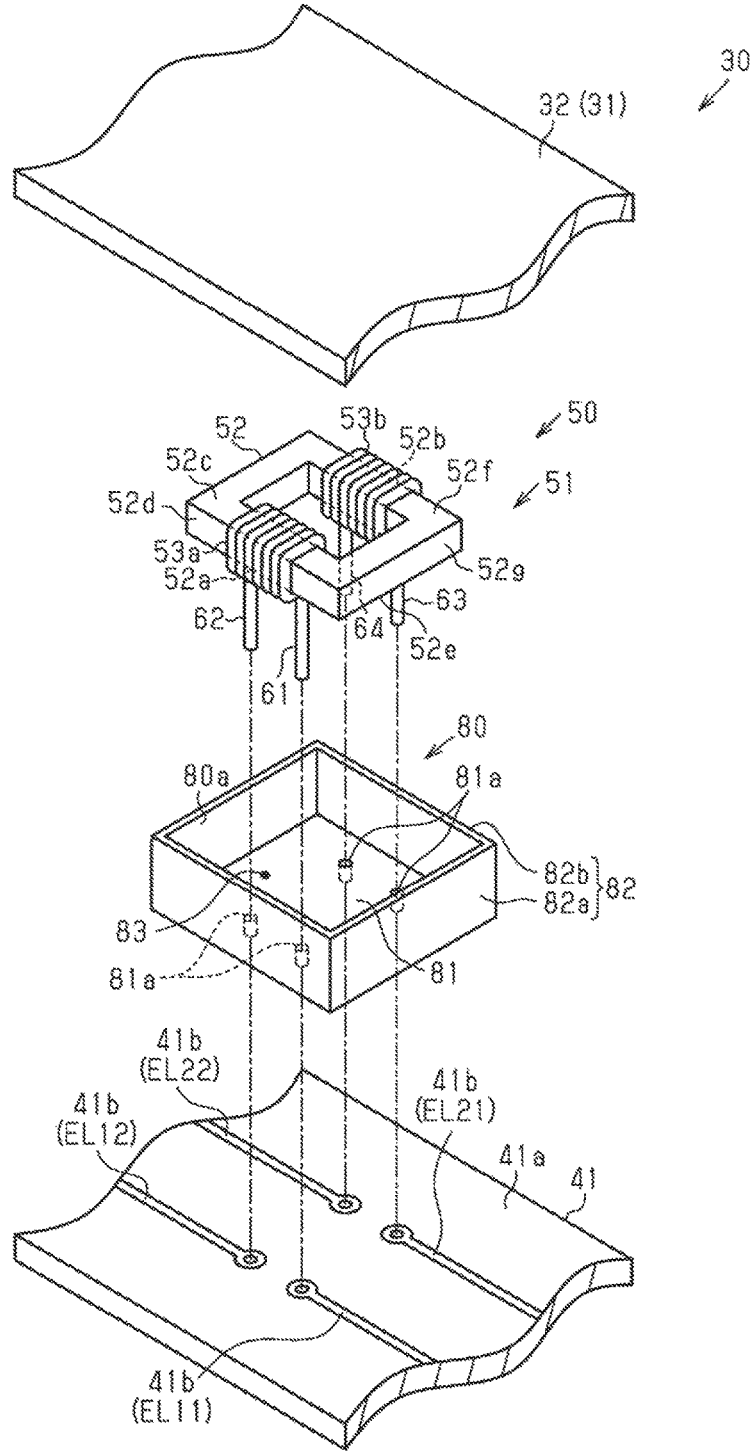
FIG. 2 is an exploded perspective view schematically showing a noise reducer of the on-board inverter shown in FIG. 1.

As shown in FIG. 2, the circuit board 41 includes a plurality of pattern wires 41b, which is part of the two wires EL1 and EL2. The pattern wires 41b are arranged, for example, in multiple layers including the board surface 41a and a surface opposite to the board surface 41a. The pattern wires 41b may have any specific structure and may be, for example, bar-shaped like a bus bar or plate-shaped.

The direct current power transferred from the connector 43 toward the power module 42, more specifically, direct current power transferred through the two wires EL1 and EL2, may contain common-mode noise and normal-mode noise.

Common-mode noise causes current to flow through the two wires EL1 and EL2 in the same direction. The common-mode noise may occur, for example, when the on-board inverter 30 and the DC power supply E are electrically connected through a path other than the two wires EL1 and EL2 (for example, vehicle body). Normal-mode noise has a predetermined frequency superimposed on direct current power. In terms of a momentary view, normal-mode noise causes current to flow through the two wires EL1 and EL2 in opposite directions. In other words, normal-mode noise is an inflow ripple component contained in direct current power flowing into the on-board inverter 30. Normal-mode noise will be described later in detail.

In this regard, the on-board inverter 30 of the present embodiment includes the noise reducer 50 that reduces (damps) common-mode noise and normal-mode noise contained in direct current power transferred from the connector 43 toward the power module 42. The noise reducer 50 is arranged on the two wires EL1 and EL2, and direct current power is supplied from the connector 43 through the noise reducer 50 to the power module 42.

The noise reducer 50 will now be described in detail.

Figure 3:
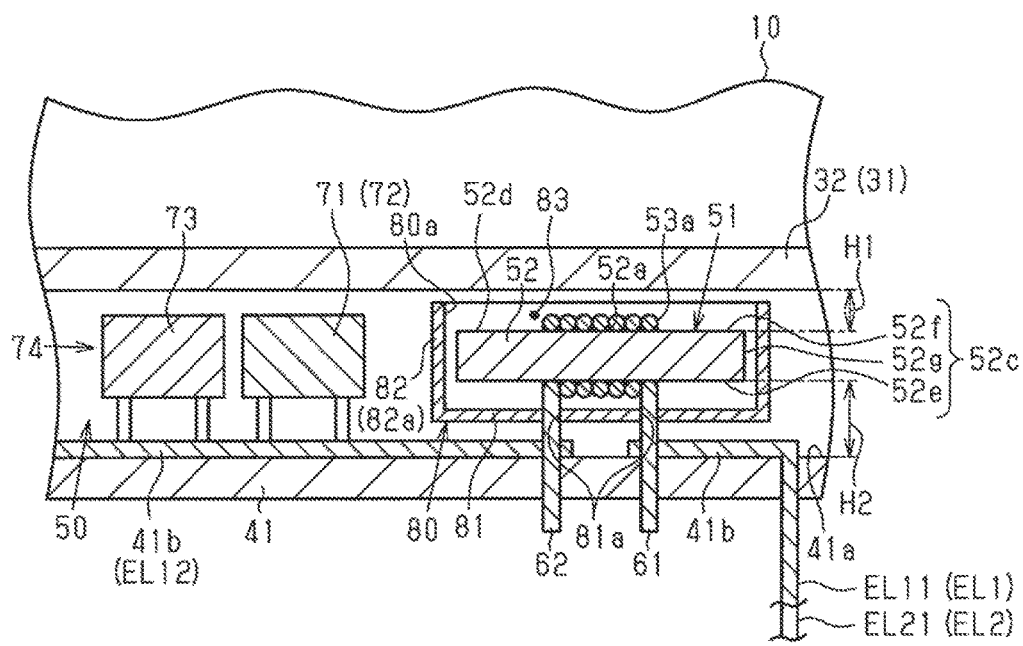
FIG. 3 is a schematic cross-sectional view of the noise reducer shown in FIG. 2.
Figure 4:
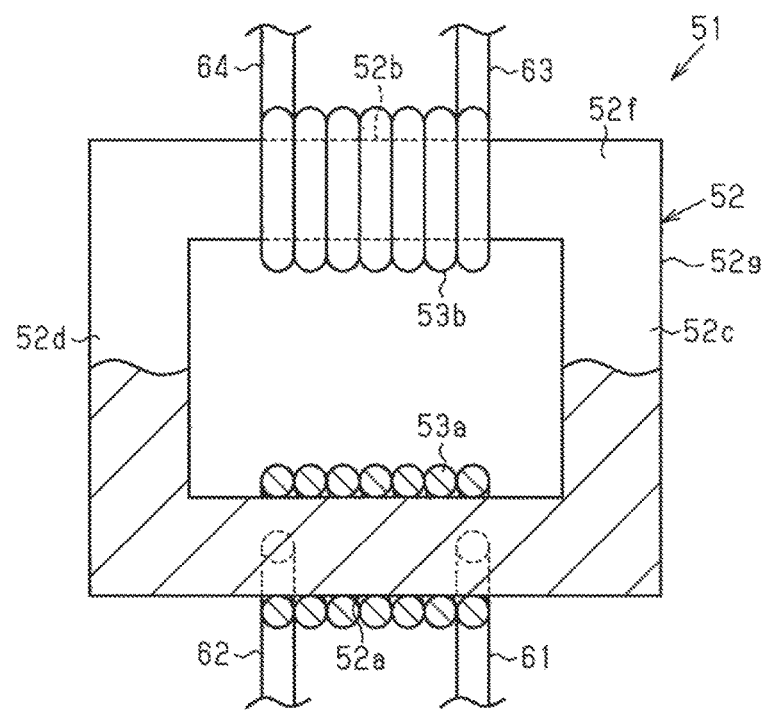
FIG. 4 is a partially cutaway view of a common-mode choke coil of the noise reducer shown in FIG. 2.

As shown in FIGS. 2 to 4, the noise reducer 50 includes, for example, a common-mode choke coil 51. The common-mode choke coil 51 includes a core 52 and a first winding 53a and a second winding 53b, which are wound around the core 52.

The core 52 is shaped as, for example, a polygonal (in the present embodiment, rectangular) ring (endless) having a predetermined thickness. In other words, the core 52 is tubular and has a predetermined height. As shown in FIGS. 2 and 4, the core 52 includes a first core portion 52a around which the first winding 53a is wound, a second core portion 52b around which the second winding 53b is wound, and an exposed portion 52d where the two windings 53a and 53b are not wound and a surface 52c of the core 52 is exposed. The two windings 53a and 53b are opposed to each other with the winding axial directions in conformance with each other. In the present embodiment, the winds (turns) of the two windings 53a and 53b are set to the same number.

In the present embodiment, the core 52 is configured by a single part. However, there is no limit to such a configuration. The core 52 may be configured by, for example, two symmetrical parts that are coupled to each other or three or more parts.

As shown in FIG. 2, the common-mode choke coil 51 includes a first input terminal 61 and a first output terminal 62, which are drawn out of the first winding 53a, and a second input terminal 63 and a second output terminal 64, which are drawn out of the second winding 53b.

Figure 5:
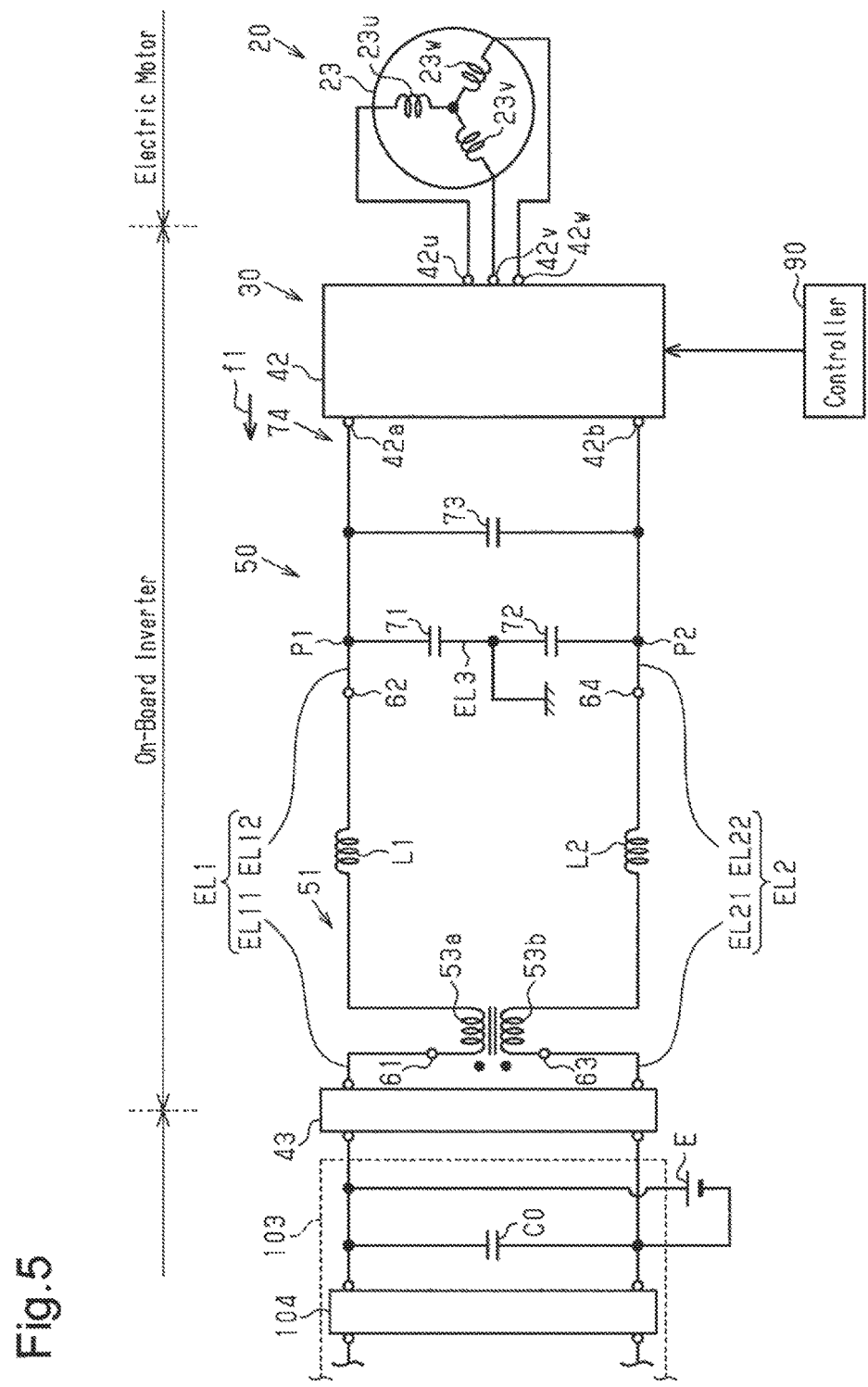
FIG. 5 is an equivalent circuit diagram showing the electrical configuration of the on-board inverter shown in FIG. 1.

As shown in FIGS. 3 and 5, the first wire EL1, which connects the + terminal of the DC power supply E to the power module 42, includes a first connector-side wire EL11, which connects the connector 43 to the first input terminal 61, and a first module-side wire EL12, which connects the first output terminal 62 to the first module input terminal 42a.

The second wire EL2, which connects the − terminal of the DC power supply E to the power module 42, includes a second connector-side wire EL21, which connects the connector 43 to the second input terminal 63, and a second module-side wire EL22, which connects the second output terminal 64 to the second module input terminal 42b. The DC power supply E supplies direct current power through the two connector-side wires EL11 and EL21, the two windings 53a and 53b, and the two module-side wires EL12 and EL22 to the power module 42. More specifically, the two module-side wires EL12 and EL22 connect an output portion of the common-mode choke coil 51 to the input portion of the power module 42. In this case, in other words, the two windings 53a and 53b are located on the wires EL1 and EL2. The two terminals 61 and 62 may be referred to as two opposite ends of the first winding 53a. The two terminals 63 and 64 may be referred to as two opposite ends of the second winding 53b. The pattern wires 41b arranged on the circuit board 41 include the two connector-side wires EL11 and EL21 and the two module-side wires EL12 and EL22.

The common-mode choke coil 51 is configured so that impedance (more specifically, inductance) relatively increases when a common-mode current flows to the two wires EL1 and EL2 and relatively decreases when a normal-mode current flows to the two wires EL1 and EL2. More specifically, the two windings 53a and 53b are wound to produce magnetic fluxes that amplify each other when common-mode currents, which flow in the same direction, flow to the two wires EL1 and EL2 (i.e., two windings 53a and 53b) and magnetic fluxes that cancel each other when normal-mode currents, which flow in the opposite directions, flow to the two wires EL1 and EL2.

Since the core 52 includes the exposed portion 52d, a leakage flux is produced in the common-mode choke coil 51 in a situation in which normal-mode currents are flowing to the two wires EL1 and EL2. More specifically, the common-mode choke coil 51 has a certain inductance with respect to normal-mode currents. The leakage flux is produced around the common-mode choke coil 51 and has a tendency to concentrate on the two opposite ends of each of the two windings 53a and 53b in the winding axial direction.

As shown in FIGS. 3 and 5, the noise reducer 50 includes bypass capacitors 71 and 72, which reduce common-mode noise, and a smoothing capacitor 73 arranged separately from the bypass capacitors 71 and 72. The smoothing capacitor 73 includes, for example, a film capacitor or an electrolytic capacitor. The smoothing capacitor 73 cooperates with the common-mode choke coil 51 to configure a low-pass filter circuit 74. The low-pass filter circuit 74 reduces normal-mode noise flowing from the DC power supply E. The low-pass filter circuit 74 is a resonance circuit and may be referred to as an LC filter.

As shown in FIG. 3, the common-mode choke coil 51 and the capacitors 71 to 73 are located between the board surface 41a of the circuit board 41 and the base member 32. The common-mode choke coil 51 is located so that the winding axial directions of the two windings 53a and 53b intersect with (more specifically, extend orthogonal to) a direction in which the board surface 41a is opposed to the base member 32. In this case, the thickness-wise direction of the core 52 conforms to the opposing direction.

The core 52 has a surface opposed to the board surface 41a, defining a core bottom surface 52e, and a surface opposed to the base member 32, defining a core upper surface 52f. The core 52 also has a surface that is continuous with the core upper surface 52f and the core bottom surface 52e and defines the periphery of the core 52, defining a core peripheral surface 52g. The core peripheral surface 52g (side surface of common-mode choke coil 51) intersects with a plane including the winding axes of the two windings 53a and 53b (in the present embodiment, plane extending orthogonal to thickness-wise direction of core 52). The core peripheral surface 52g extends along a magnetic flux passing through the core 52 and intersects with a leakage flux.

In the present embodiment, the core peripheral surface 52g is parallel to the thickness-wise direction of the core 52. The core peripheral surface 52g includes a portion intersecting with (more specifically, extending orthogonal to) the winding axial directions of the two windings 53a and 53b and a portion extending parallel to the winding axial directions of the two windings 53a and 53b.

The common-mode choke coil 51 has side surfaces defined by the core peripheral surface 52g (more specifically, portion of core peripheral surface 52g defining exposed portion 52d) and portions of the two windings 53a and 53b located on the core peripheral surface 52g.

As shown in FIGS. 2 and 3, the on-board inverter 30 includes a damping portion 80, which lowers the Q factor of the low-pass filter circuit 74. The damping portion 80 is located at a position intersecting with the magnetic path of a leakage flux produced from the common-mode choke coil 51 and produces an eddy current with the leakage flux produced from the common-mode choke coil 51.

The damping portion 80 is formed from, for example, a non-magnetic, electro-conductive material such as aluminum. Preferably, the relative permeability of the damping portion 80 is set to, for example, 0.9 to 3.

The damping portion 80 is located between the board surface 41a of the circuit board 41 and the base member 32 and is shaped as a box having an opening 80a toward the base member 32 and a bottom portion (wall end). The damping portion 80 entirely covers the core bottom surface 52e and the core peripheral surface 52g. More specifically, the damping portion 80 includes a damping bottom portion 81 and a damping side portion 82. The damping bottom portion 81 covers the core bottom surface 52e, that is, the bottom surface of the common-mode choke coil 51. The damping side portion 82 covers the core peripheral surface 52g, that is, the side surface of the common-mode choke coil 51.

The damping side portion 82 is a wall extending upright from the damping bottom portion 81 toward the base member 32, or the heatsink 10, and is opposed to the core peripheral surface 52g. More specifically, the damping side portion 82 includes a first side 82a opposed to a portion of the core peripheral surface 52g intersecting with the winding axial directions of the two windings 53a and 53b and a second side 82b opposed to a portion of the core peripheral surface 52g extending parallel to the winding axial directions of the two windings 53a and 53b. The edge of the damping side portion 82 projects toward the base member 32 beyond the two windings 53a and 53b. The damping side portion 82 intersects with a plane including the winding axes of the two windings 53a and 53b.

In the present embodiment, the damping portion 80 covers a portion of the core peripheral surface 52g defining the exposed portion 52d and portions of the two windings 53a and 53b located on the core peripheral surface 52g. In other words, since the side surface of the common-mode choke coil 51 includes the core peripheral surface 52g and the portions of the two windings 53a and 53b located on the core peripheral surface 52g, the damping portion 80 covers the side surface of the common-mode choke coil 51.

The opening 80a of the damping portion 80 is covered by the base member 32 of the inverter case 31. The damping portion 80 and the base member 32 define an accommodation space 83. The accommodation space 83 accommodates the common-mode choke coil 51. The core upper surface 52f of the common-mode choke coil 51, which is opposite to the core bottom surface 52e, is opposed to the base member 32 and covered by the base member 32.

In this configuration, the magnetic path of a leakage flux produced from the common-mode choke coil 51 intersects with the damping portion 80. Thus, the leakage flux passes through the damping portion 80. This produces an eddy current in the damping portion 80, interfering with the passing of the leakage flux and reducing the leakage flux. More specifically, the damping portion 80 has magnetic resistance to the leakage flux produced from the common-mode choke coil 51.

The damping portion 80 is insulated from the common-mode choke coil 51. Any specific configuration may be used to insulate the damping portion 80 from the common-mode choke coil 51. For example, the damping portion 80 and the common-mode choke coil 51 may be configured to be opposed to each other with a gap or an insulation layer located in between.

In the present embodiment, the edge of the damping side portion 82 is separated from the base member 32. However, the edge of the damping side portion 82 may be in contact with the base member 32. In this case, the damping portion 80 and the base member 32 (inverter case 31) form a closed loop. Thus, an eddy current is produced in a preferred manner. Alternatively, a conductive or insulative inclusion may be located between the edge of the damping side portion 82 and the base member 32.

As shown in FIGS. 2 and 3, through holes 81a extend through the damping bottom portion 81 to allow for insertion of the terminals 61 to 64. The terminals 61, 62, 63, and 64 are inserted through the through holes 81a and connected to the respective wires EL11, EL12, EL21, and EL22.

Although not shown in the drawings, an insulator is located between each of the terminals 61 to 64 and the wall surface of the through hole 81a. Thus, the terminals 61 to 64 are electrically insulated from the damping portion 80.

As shown in FIG. 1, the common-mode choke coil 51 is located at a position further from the power module 42 than the capacitors 71 to 73. More specifically, the capacitors 71 to 73 are located between the common-mode choke coil 51 and the power module 42.

The common-mode choke coil 51 and the capacitors 71 to 73 are thermally connected to the heatsink 10. More specifically, the common-mode choke coil 51 and the capacitors 71 to 73 are located in the proximity of the inverter case 31 (base member 32), which is in contact with the heatsink 10. For example, a distance H1 between the core upper surface 52f and the base member 32 is set to be shorter than a distance H2 between the core bottom surface 52e and the circuit board 41. When heat is generated in the common-mode choke coil 51 and the capacitors 71 to 73, the heat is transferred to the base member 32 and absorbed by the heatsink 10. As shown in FIG. 3, each of the capacitors 71 to 73 has terminals, and the terminals are connected to the pattern wires 41b of the circuit board 41.

The electrical configuration of the on-board inverter 30 will now be described with reference to FIGS. 5 and 6.

As described above, the noise reducer 50 is located at the input side of the power module 42 (more specifically, switching elements Qu1 to Qw2). More specifically, the common-mode choke coil 51 of the noise reducer 50 is located between the two connector-side wires EL11 and EL21 and the two module-side wires EL12 and EL22.

When a normal-mode current flows, the common-mode choke coil 51 produces a leakage flux. With regard to this point, as shown in FIG. 5, the common-mode choke coil 51 may be considered to have virtual normal-mode coils L1 and L2 in addition to the two windings 53a and 53b. In other words, in an equivalent circuit, the common-mode choke coil 51 of the present embodiment includes both the two windings 53a and 53b and the virtual normal-mode coils L1 and L2. The virtual normal-mode coils L1 and L2 are connected in series to the windings 53a and 53b. Although not shown in the drawings, the damping portion 80 functions as impedance that lowers the Q factor of the low-pass filter circuit 74.

In addition to the on-board inverter 30, for example, a power control unit 103 (PCU) is mounted on the vehicle as an on-board device. The PCU 103 drives a travel motor mounted on the vehicle using direct current power supplied from the DC power supply E. More specifically, in the present embodiment, the PCU 103 and the on-board inverter 30 are connected in parallel to the DC power supply E, and the DC power supply E is shared by the PCU 103 and the on-board inverter 30.

The PCU 103 includes, for example, a step-up converter 104 and a travel inverter. The step-up converter 104 includes a step-up switching element and increases the voltage of direct current power of the DC power supply E by cyclically switching the step-up switching element on and off. The travel inverter converts the direct current power, the voltage of which is increased by the step-up converter 104, into drive power capable of driving the travel motor.

In this configuration, noise generated by the switching of the step-up switching element enters the on-board inverter 30 as normal-mode noise. In other words, normal-mode noise contains a noise component corresponding to a switching frequency of the step-up switching element. Since the switching frequency of the step-up switching element varies depending on types of vehicle, the frequency of normal-mode noise varies depending on the type of a vehicle. The noise component corresponding to the switching frequency of the step-up switching element may include a noise component having a frequency that is the same as the switching frequency and its harmonic components.

The two bypass capacitors 71 and 72 are connected in series to each other. Each of the first bypass capacitor 71 and the second bypass capacitor 72 has a first end and a second end opposite to the first end. More specifically, the noise reducer 50 includes a bypass line EL3 connecting the first end of the first bypass capacitor 71 to the first end of the second bypass capacitor 72. The bypass line EL3 is grounded to a body of the vehicle.

The series-connected body of the two bypass capacitors 71 and 72 is connected in parallel to the common-mode choke coil 51. More specifically, the second end of the first bypass capacitor 71 is connected to the first module-side wire EL12, which connects the first winding 53a (first output terminal 62) to the power module 42 (first module input terminal 42a). The second end of the second bypass capacitor 72 is connected to the second module-side wire EL22, which connects the second winding 53b (second output terminal 64) to the power module 42 (second module input terminal 42b).

The smoothing capacitor 73 is located at the output side of the common-mode choke coil 51 and the input side of the power module 42. More specifically, the smoothing capacitor 73 is located between the series-connected body of the two bypass capacitors 71 and 72 and the power module 42 and connected in parallel to the series-connected body of the two bypass capacitors 71 and 72 and the power module 42. The smoothing capacitor 73 has a first end and a second end opposite to the first end. More specifically, the first end of the smoothing capacitor 73 is connected to a portion of the first module-side wire EL12 between the power module 42 and a connection point P1 with the first bypass capacitor 71. The second end of the smoothing capacitor 73 is connected to a portion of the second module-side wire EL22 between the power module 42 and a connection point P2 with the second bypass capacitor 72.

Figure 6:
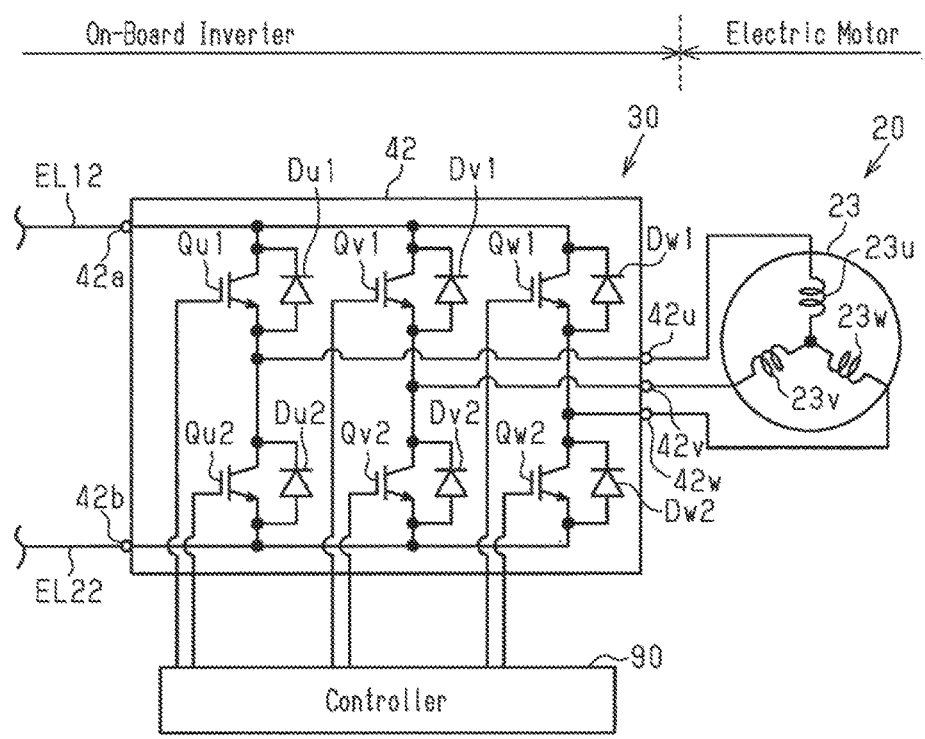
FIG. 6 is a circuit diagram showing the electrical configuration of the on-board inverter shown in FIG. 1.

As shown in FIG. 6, the coil 23 of the electric motor 20 has a three-phase structure having, for example, a u-phase coil 23u, a v-phase coil 23v, and a w-phase coil 23w. The coils 23u to 23w are connected, for example, in the form of Y.

The power module 42 is an inverter circuit. The power module 42 includes u-phase switching elements Qu1 and Qu2 corresponding to the u-phase coil 23u, v-phase switching elements Qv1 and Qv2 corresponding to the v-phase coil 23v, and w-phase switching elements Qw1 and Qw2 corresponding to the w-phase coil 23w. The switching elements Qu1 to Qw2 are each, for example, a power switching element such as an IGBT. The switching elements Qu1 to Qw2 include freewheeling diodes Du1 to Dw2 (body diodes).

The u-phase switching elements Qu1 and Qu2 are connected in series to each other by a connection line. The connection line is connected to the u-phase coil 23u via a u-phase module output terminal 42u. Direct current power is input to the series-connected body of the u-phase switching elements Qu1 and Qu2 from the DC power supply E. More specifically, the collector of the first u-phase switching element Qu1 is connected to the first module input terminal 42a and to the first module-side wire EL12 via the first module input terminal 42a. The emitter of the second u-phase switching element Qu2 is connected to the second module input terminal 42b and to the second module-side wire EL22 via the second module input terminal 42b.

The u-phase switching elements Qu1 and Qu2 and the remaining switching elements Qv1, Qv2, Qw1, and Qw2 have the same connection mode except that the corresponding coils differ from each other. In this case, the switching elements Qu1 to Qw2 are connected to the two module-side wires EL12 and EL22.

The v-phase switching elements Qv1 and Qv2 are connected in series to each other by a connection line that is connected to the v-phase coil 23v via a v-phase module output terminal 42v. The w-phase switching elements Qw1 and Qw2 are connected in series to each other by a connection line that is connected to the w-phase coil 23w via a w-phase module output terminal 42w. More specifically, the module output terminals 42u to 42w of the power module 42 are connected to the electric motor 20.

The on-board inverter 30 includes a controller 90 that controls the power module 42 (more specifically, switching operations of switching elements Qu1 to Qw2). The controller 90 cyclically switches the switching elements Qu1 to Qw2 on and off based on external instructions. More specifically, the controller 90 performs pulse width modulation control (PWM control) on the switching elements Qu1 to Qw2 based on external instructions. More specifically, the controller 90 generates a control signal using a carrier signal (carrier wave signal) and an instructed voltage signal (comparison signal). Then, the controller 90 performs on-off control on the switching elements Qu1 to Qw2 using the generated control signal to convert direct current power into alternating current power.

The low-pass filter circuit 74 uses a cutoff frequency fc that is set to be lower than a carrier frequency f1, that is, the frequency of the carrier signal. Also, the carrier frequency f1 may be referred to as the switching frequency of each of the switching elements Qu1 to Qw2.

Figure 7:
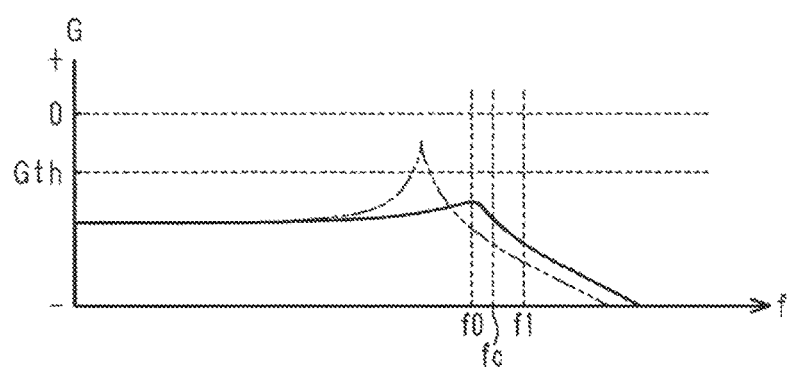
FIG. 7 is a graph showing frequency characteristics of a low-pass filter circuit in relation to normal-mode noise.

Frequency characteristics of the low-pass filter circuit 74 of the present embodiment will now be described with reference to FIG. 7. FIG. 7 is a graph showing the frequency characteristics of the low-pass filter circuit 74 in relation to entered normal-mode noise. The solid line of FIG. 7 shows frequency characteristics when the damping portion 80 is provided. The double-dashed line of FIG. 7 shows frequency characteristics when the damping portion 80 is not provided.

As indicated by the double-dashed line in FIG. 7, when the damping portion 80 is not provided, the Q factor of the low-pass filter circuit 74 is relatively high. Thus, reduction of normal-mode noise with the noise reducer 50 is limited at frequencies close to a resonance frequency f0 of the low-pass filter circuit 74.

In the present embodiment, the damping portion 80 is provided, and the Q factor of the low-pass filter circuit 74 is low as indicated by the solid line in FIG. 7. Thus, the noise reducer 50 reduces normal-mode noise having frequencies close to the resonance frequency f0 of the low-pass filter circuit 74.

As shown in FIG. 7, gain G (damping ratio) required based on specifications of the vehicle is referred to as an allowable gain Gth. When normal-mode noise has a frequency that is the same as the resonance frequency f0, a Q factor at which the gain G of the low-pass filter circuit 74 reaches the allowable gain Gth is referred to as a specified Q factor. With this configuration, in the present embodiment, the Q factor of the low-pass filter circuit 74 is lower than the specified Q factor because of the damping portion 80. Thus, when normal-mode noise has a frequency that is the same as the resonance frequency f0, the gain G of the low-pass filter circuit 74 is smaller than the allowable gain Gth (but is larger as absolute value). In other words, the damping portion 80 is configured so that the Q factor of the low-pass filter circuit 74 is decreased to be lower than the specified Q factor.

The common-mode choke coil 51 has a leakage flux (i.e., inductance of virtual normal-mode coils L1 and L2) that is decreased because of the damping portion 80. Thus, in the present embodiment, the resonance frequency F0 of the low-pass filter circuit 74 is slightly higher than when the damping portion 80 is not provided.

The present embodiment has the advantages described below.

(1) The on-board inverter 30 includes the power module 42, which converts direct current power into alternating current power, and the noise reducer 50, which is located at the input side of the power module 42 to reduce common-mode noise and normal-mode noise contained in direct current power. The noise reducer 50 includes the common-mode choke coil 51 including the core 52, the first winding 53a wound around the first core portion 52a of the core 52, and the second winding 53b wound around the second core portion 52b of the core 52. The on-board inverter 30 is configured so that common-mode noise and normal-mode noise of direct current power is reduced by the common-mode choke coil 51 and then the direct current power is input to the power module 42. More specifically, the on-board inverter 30 includes the module-side wires EL12 and EL22 connecting the common-mode choke coil 51 to the power module 42.

With this configuration, the common-mode choke coil 51 reduces common-mode noise contained in direct current power before the direct current power is input to the on-board inverter 30. When a normal-mode current flows, the common-mode choke coil 51 produces a leakage flux. This allows the low-pass filter circuit 74, which includes the common-mode choke coil 51 and the smoothing capacitor 73, to reduce normal-mode noise. Without provision of a dedicated coil that reduces normal-mode noise, direct current power in which common-mode noise and normal-mode noise are reduced is input to the power module 42. This limits enlargement of the on-board inverter 30.

(2) The on-board inverter 30 includes the smoothing capacitor 73, which cooperates with the common-mode choke coil 51 to configure the low-pass filter circuit 74, and the damping portion 80, which is located at a position intersecting with the magnetic path of a leakage flux produced from the common-mode choke coil 51. The damping portion 80 lowers the Q factor of the low-pass filter circuit 74 by producing an eddy current with the leakage flux produced from the common-mode choke coil 51. With this configuration, the low-pass filter circuit 74 reduces normal-mode noise in a preferred manner. Additionally, the Q factor of the low-pass filter circuit 74 is lowered without provision of a damping resistor or the like. Thus, while limiting enlargement of the on-board inverter 30, the versatility may be improved.

More specifically, as described above, if the low-pass filter circuit 74 has a high Q factor, normal-mode noise having frequencies close to the resonance frequency f0 of the low-pass filter circuit 74 is not easily reduced. Thus, the low-pass filter circuit 74 having a high Q factor may not effectively function on normal-mode noise having frequencies close to the resonance frequency f0. This may cause erroneous operation of the on-board inverter 30 and shorten the life of the low-pass filter circuit 74. Hence, the low-pass filter circuit 74 having a high Q factor cannot be applied to a type of vehicle that produces normal-mode noise having frequencies close to the resonance frequency f0. In this regard, in the present embodiment, since the Q factor is lowered by the damping portion 80, normal-mode noise having frequencies close to the resonance frequency f0 is easily reduced by the noise reducer 50 (more specifically, the low-pass filter circuit 74). Thus, the noise reducer 50 is capable of reducing a wider frequency band of normal-mode noise. Accordingly, the on-board inverter 30 is applicable to a wide range of vehicle types.

For example, a damping resistor can be connected in series to the common-mode choke coil 51 to lower the Q factor. However, a damping resistor needs to meet a relatively high current, that is, 10 A or higher, and thus tends to be relatively large. Accordingly, power loss and the amount of generated heat tend to increase. The damping resistor needs to be arranged, for example, taking into consideration heat dissipation performance. This may result in enlargement of the on-board inverter 30. In this regard, in the present embodiment, a leakage flux produces an eddy current in the damping portion 80. The eddy current is lower than current that flows to the damping resistor. Thus, the amount of heat generated by the damping portion 80 tends to be small. Additionally, the damping portion 80 only needs to be located at a position intersecting with the magnetic path of a leakage flux produced from the common-mode choke coil 51. This increases the degree of freedom for arrangement and allows for installation in a relatively narrow space. Therefore, while limiting enlargement of the on-board inverter 30 and reducing noise, the versatility may be improved.

(3) The damping portion 80 covers the side surface of the common-mode choke coil 51, more specifically, the core peripheral surface 52g and the portions of the two windings 53a and 53b located on the core peripheral surface 52g. The core peripheral surface 52g intersects with a plane including the winding axes of the two windings 53a and 53b. Thus, the damping portion 80 functions as magnetic resistance to a leakage flux. More specifically, the damping portion 80 functions as magnetic resistance that lowers the Q factor. Thus, advantage (2) is obtained with a relatively simple configuration.

(4) The on-board inverter 30 includes the inverter case 31 accommodating the circuit board 41, the power module 42, and the noise reducer 50. The damping portion 80 is shaped as a box having the opening 80a covered by the inverter case 31. The common-mode choke coil 51 is accommodated in the accommodation space 83 defined by the damping portion 80 and the inverter case 31. The damping portion 80 covers surfaces of the core 52 other than the core upper surface 52f, which corresponds to the opening 80a, (more specifically, core peripheral surface 52g and core bottom surface 52e). Thus, the Q factor of the low-pass filter circuit 74 is lowered in a further preferred manner. Additionally, the inverter case 31 is formed from a thermal-conductive, non-magnetic, electro-conductive material. The inverter case 31, which covers the opening 80a, functions to lower the Q factor. This further lowers the Q factor.

(5) In particular, the common-mode choke coil 51 is located in the proximity of the inverter case 31 so that the distance H1 between the core upper surface 52f and the base member 32 is shorter than the distance H2 between the core bottom surface 52e and the circuit board 41. This increases the damping effect of the inverter case 31 and further lowers the Q factor.

(6) The power module 42, which includes the plurality of switching elements Qu1 to Qw2, converts direct current power into alternating current power through PWM control performed on the plurality of switching elements Qu1 to Qw2. The cutoff frequency fc of the low-pass filter circuit 74 is set to be lower than the carrier frequency f1, which is the frequency of a carrier signal used in PWM control of the switching elements Qu1 to Qw2. The low-pass filter circuit 74 reduces (dampens) ripple noise caused by the switching of the switching elements Qu1 to Qw2 (normal-mode noise produced at power module 42). This limits the ripple noise flowing out of the on-board inverter 30. More specifically, the low-pass filter circuit 74 functions to reduce normal-mode noise and common-mode noise flowing into the on-board inverter 30 during operation of the PCU 103 and reduce the outflow of ripple noise during operation of the on-board inverter 30.

To widen the frequency band of normal-mode noise that can be reduced by the noise reducer 50, the resonance frequency f0 may be set to be higher than an expected frequency band of normal-mode noise to avoid occurrence of a resonance action. However, in this case, the cutoff frequency fc of the low-pass filter circuit 74 will also be increased, and thus it is difficult to set the cutoff frequency fc to be lower than the carrier frequency f1 as described above. If the carrier frequency f1 is increased in accordance with increases of the cutoff frequency fc, an increased switching loss of the switching elements Qu1 to Qw2 will result and is not preferable.

In this regard, in the present embodiment, as described above, the damping portion 80 reduces normal-mode noise having frequencies close to the resonance frequency f0. Thus, the resonance frequency f0 does not need to be increased in accordance with an expected frequency band of normal-mode noise. Accordingly, the cutoff frequency fc may be set to be lower than the carrier frequency f1 without an excessive increase in the carrier frequency f1. This limits ripple noise caused by the switching of the switching elements Qu1 to Qw2 and flowing out of the on-board inverter 30 while limiting, for example, increases in the power loss of the power module 42.

(7) The core 52 includes the first core portion 52a around which the first winding 53a is wound, the second core portion 52b around which the second winding 53b is wound, and the exposed portion 52d where the two windings 53a and 53b are not wound and the surface 52c is exposed. This facilitates production of a leakage flux when a normal-mode current flows to the two wires EL1 and EL2 (more specifically, two windings 53a and 53b). Thus, advantage (1) is obtained.

The above embodiment may be modified as follows.

Figure 8:
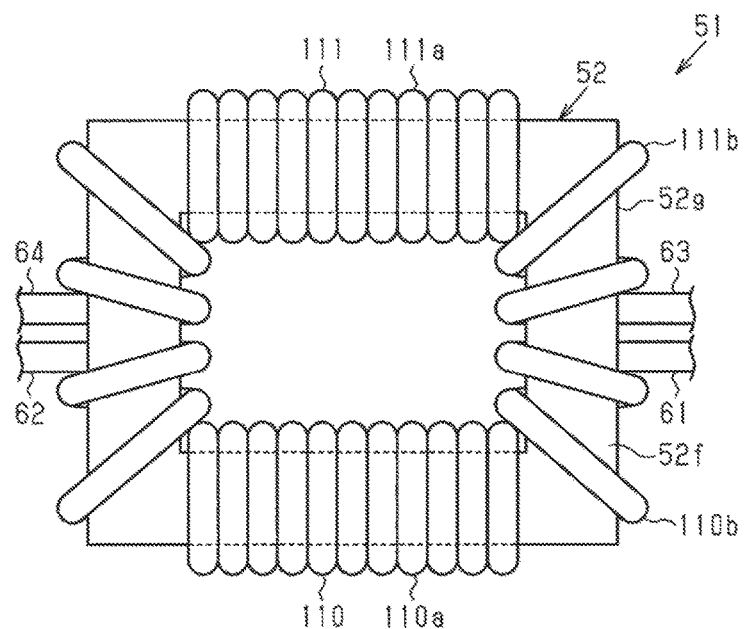
FIG. 8 is a front view schematically showing a further example of a common-mode choke coil.

As shown in FIG. 8, the two windings 110 and 111 are wound on the entire core 52. In this case, the two windings 110 and 111 may include high density portions 110a and 111a and low density portions 110b and 111b, which relatively differ from each other in winding density. Winding density is the number of winds (turns) per unit length in the winding axial direction. This case also facilitates production of a leakage flux from the common-mode choke coil 51. One of the first winding 110 and the second winding 111 may include a high density portion and a low density portion. In this case, an exposed portion and a low density portion are both provided. Only at least one of the first winding 110 and the second winding 111 needs to include a high density portion and a low density portion.

The shape of the damping portion 80 is not limited to that of the above embodiment. For example, the damping portion 80 may be shaped as a box that includes an upper surface cover located between the core upper surface 52f and the base member 32 to cover the core upper surface 52f. The damping portion 80 does not necessarily have to be shaped as a completely closed box and may have, for example, a gap (slit) between the first side 82a and the second side 82b or a through hole. Further, at least part of the damping portion 80 may be mesh. At least part of the damping portion 80 may be recessed, embossed, or punched to form a hole. The damping bottom portion 81 may be omitted so that the damping portion 80 is frame-shaped.

The damping side portion 82 covers the entire core peripheral surface 52g. Instead, the damping side portion 82 may cover a portion of the core peripheral surface 52g. For example, one of the first side 82a and the second side 82b may be omitted. Of the side surface of the common-mode choke coil 51, the damping portion 80 may be configured to cover only the portion of the core peripheral surface 52g defining the exposed portion 52d and does not cover the portions of the two windings 53a and 53b located on the core peripheral surface 52g and vice versa. The damping portion 80 may be configured to partially or entirely cover the portion of the core peripheral surface 52g defining the exposed portion 52d and partially or entirely cover the portions of the two windings 53a and 53b located on the core peripheral surface 52g. The damping portion 80 only needs to cover at least a portion of the side surface of the common-mode choke coil 51. The damping portion may be located inside the core 52. In other words, the damping portion 80 may be located at a position intersecting with a leakage flux produced from the common-mode choke coil 51 and opposed to at least a portion of the common-mode choke coil 51.

The material of the damping portion 80 only needs to be a non-magnetic metal and is not limited to aluminum. For example, the material may be copper.

Through holes may extend through the damping side portion 82 to allow for insertion of the terminals 61 to 64, and the terminals 61 to 64 may be configured to extend sideward. Also, in this case, the damping side portion 82 covers the entire core peripheral surface 52g.

Figure 9:
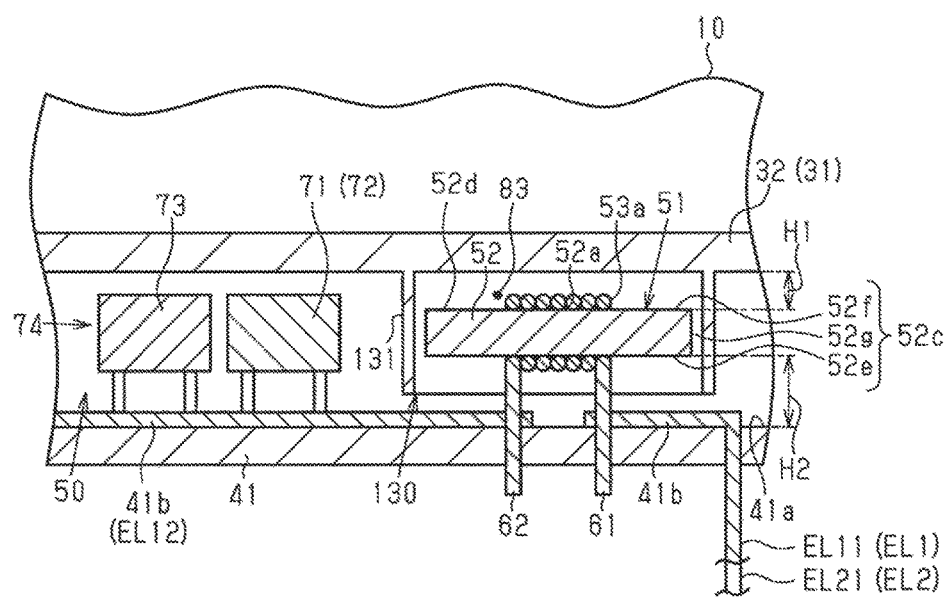
FIG. 9 is a cross-sectional view schematically showing a further example of a damping portion.

As shown in FIG. 9, a damping portion 130 may extend upright from the base member 32 and be configured to have a damping side portion 131 surrounding the core peripheral surface 52g. More specifically, the damping portion may be separate from the inverter case 31 or integrated with the inverter case 31.

The common-mode choke coil 51 and the damping portion 80 may be located at any position in the inverter case 31. For example, as shown in FIG. 10, the common-mode choke coil 51 and the damping portion 80 may be located at a side of the circuit board 41 and project out of the circuit board 41 instead of between the board surface 41a of the circuit board 41 and the base member 32.

Figure 10:
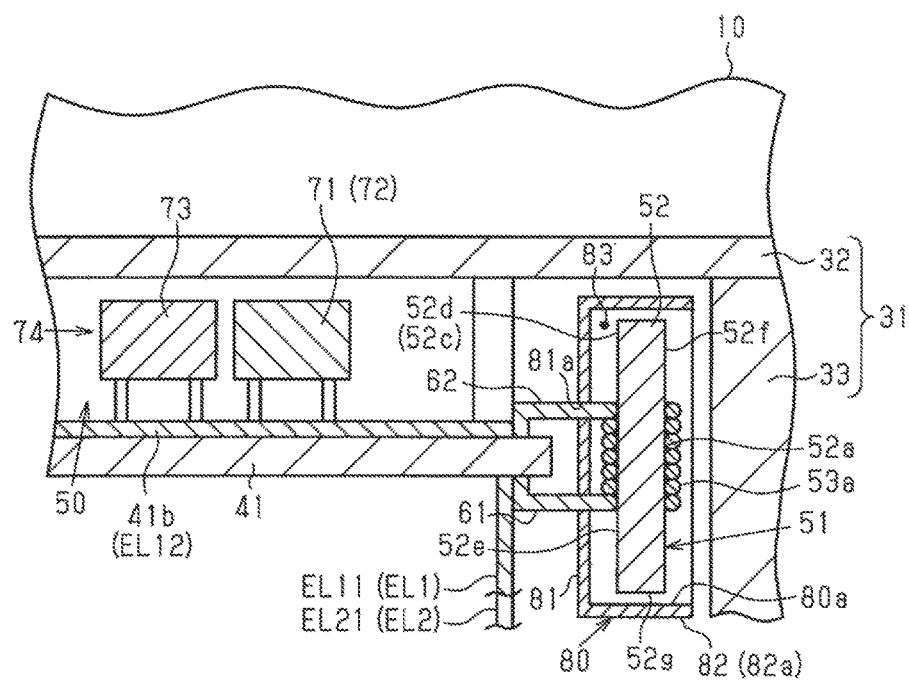
FIG. 10 is a cross-sectional view schematically showing a further example of a damping portion.

As shown in FIG. 10, the common-mode choke coil 51 may be located so that the opposing direction of the board surface 41a and the base member 32 (i.e., thickness-wise direction of board 41) intersects with (extends orthogonal to) the thickness-wise direction of the core 52. In this case, the damping portion 80 may be located so that the opening 80a is covered by the cover member 33.

With the winding axial directions of the two windings 53a and 53b conforming to the opposing direction of the board surface 41a and the base member 32, the common-mode choke coil 51 may extend upright between the board surface 41a and the base member 32.

The step-up converter 104 is omitted. In this case, normal-mode noise may be caused, for example, by a switching frequency of the switching elements of the travel inverter.

A non-magnetic, insulative accommodation case (e.g., resin case) may be further provided to accommodate the common-mode choke coil 51. In this case, preferably, the damping portion is a film (e.g., aluminum film) that is formed from a non-magnetic, electro-conductive material and covers the common-mode choke coil 51 including the accommodation case.

The inverter case 31 and the damping portion 80 may be formed from different materials.

The base member 32 may be omitted. In this case, preferably, the two windings 53a and 53b and the edge of the damping side portion 82 are located in the proximity of or in contact with the heatsink 10 with a gap or an insulation layer located in between.

For example, in a structure in which an annular rib extends upright from an outer surface of the heatsink 10, a plate-shaped inverter cover member may be faced and coupled to the rib instead of the inverter case. In this case, preferably, the heatsink 10, the rib, and the inverter cover member define an accommodation compartment that accommodates various components such as the circuit board 41, the power module 42, and the noise reducer 50. Any specific configuration may be used to define the accommodation compartment.

The core 52 may have any shape. For example, a UU core, an EE core, or a toroidal core may be used as the core. The core does not necessarily have to be completely-closed ring-shaped and may have a gap. The core peripheral surface 52g may be curved.

The two module-side wires EL12 and EL22 may be omitted, and the two output terminals 62 and 64 of the common-mode choke coil 51 may be directly connected to the two module input terminals 42a and 42b of the power module 42. Additionally, for example, the smoothing capacitor 73 may be directly connected to the two output terminals 62 and 64.

The electric motor 20 may drive any subject, which is, for example, the travel motor mounted on the vehicle. When the drive subject of the electric motor 20 is the travel motor and the DC power supply E is an on-board power storage device, the on-board inverter 30 may perform power conversion after the voltage of the DC power supply E is increased by a step-up circuit.

The on-board device is not limited to the PCU 103 and may be any device as long as the device has a switching element that cyclically switches on and off. The on-board device may be an inverter arranged separately from the on-board inverter 30.

The specific circuit configuration of the noise reducer 50 is not limited to that of the above embodiment. For example, the smoothing capacitor 73 may be omitted. Two smoothing capacitors 73 may be arranged. The positions of the bypass capacitors 71 and 72 and the smoothing capacitor 73 may be switched to each other. The bypass capacitors 71 and 72 may be arranged at a preceding stage of the common-mode choke coil 51 (between common-mode choke coil 51 and connector 43). The low-pass filter circuit may be any type such as π-type or T-type.

The power module 42 of the embodiment is an inverter circuit. Instead, a DC/DC converter circuit may be used. More specifically, the power conversion circuit may convert direct current power into direct current power or convert direct current power into alternating current power.

The above modified examples may be combined with one another. The above modified examples may be combined with the above embodiment.

Second Embodiment

A second embodiment will now be described focusing on the differences from the first embodiment.

Figure 11:
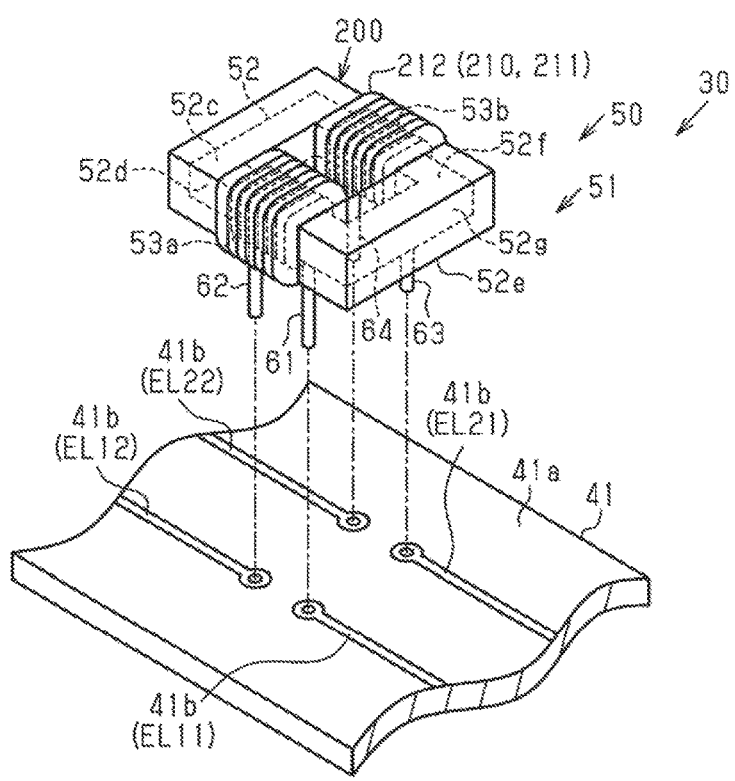
FIG. 11 is an exploded perspective view schematically showing a noise reducer in a second embodiment.
Figure 12:
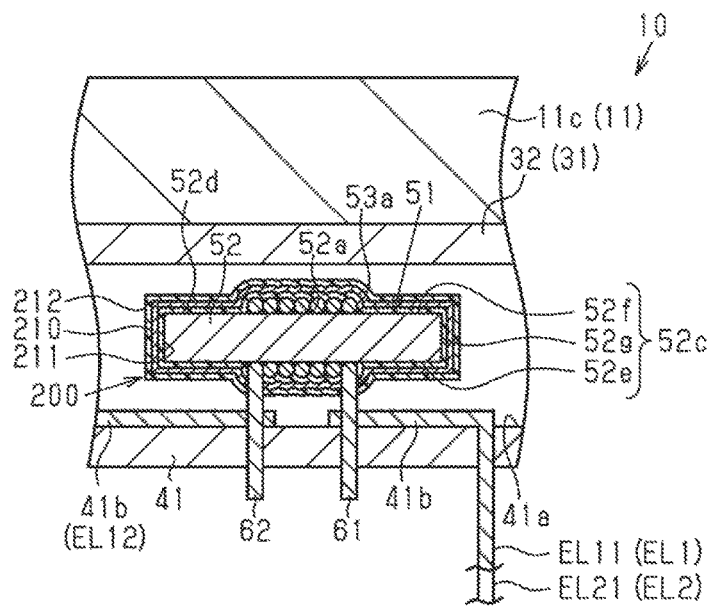
FIG. 12 is a cross-sectional view schematically showing the noise reducer of FIG. 11.
Figure 13:
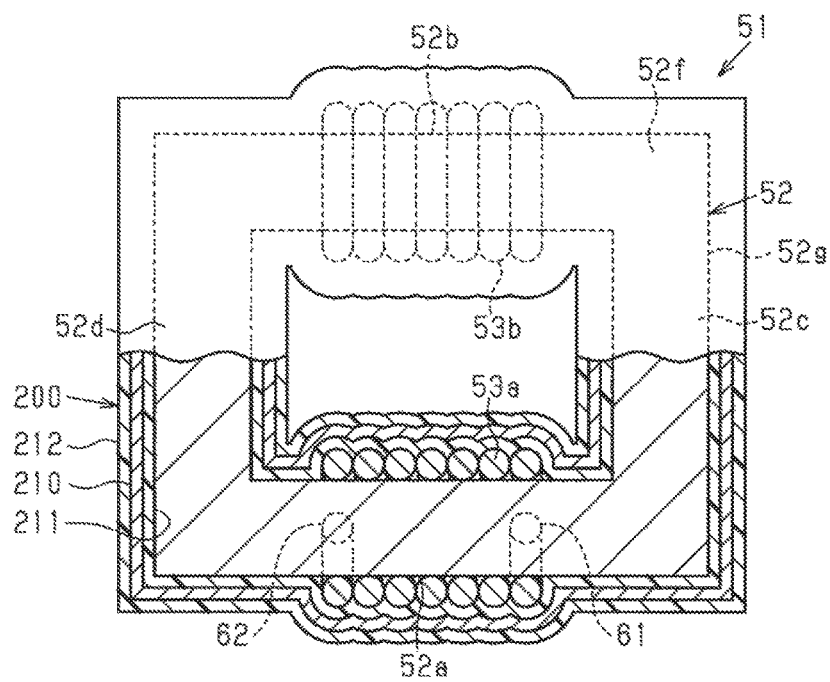
FIG. 13 is a partially cutaway view of a common-mode choke coil and a damping portion in the noise reducer of FIG. 11.

FIGS. 11, 12, and 13 show a noise reducer (damping portion 200) of the second embodiment.

In the first embodiment, as shown in FIGS. 2 and 3, the damping portion 80 is shaped as a box having the bottom portion (wall end) and the opening 80a, which is covered by the inverter case 31. The common-mode choke coil 51 is accommodated in the accommodation space 83, which is defined by the damping portion 80 and the inverter case 31, to lower the Q factor of the low-pass filter circuit 74. However, when the common-mode choke coil 51 is mounted on the circuit board 41, it may be difficult to cover the six sides of the common-mode choke coil 51 with metal.

In the second embodiment, the common-mode choke coil 51 is plated so that the common-mode choke coil 51 is covered with a shielding electro-conductive metal film 210 and so that the damping portion 200 is formed from the shielding electro-conductive metal film 210 that covers at least a portion of the common-mode choke coil 51. When the common-mode choke coil 51 is plated, a coating insulation film 211 is located between the shielding electro-conductive metal film 210 and the common-mode choke coil 51 so that the shielding electro-conductive metal film 210 is in tight contact with the common-mode choke coil 51 to ensure insulation. This obtains the same advantage as when the six sides of the common-mode choke coil 51 are covered with metal.

The detail will be described below.

At least a portion of the surface of the common-mode choke coil 51 is covered with the shielding electro-conductive metal film 210. The shielding electro-conductive metal film 210 is formed by a copper plating film, and the shielding electro-conductive metal film 210 is formed from a non-magnetic, electro-conductive material. The insulation film 211 is located between the shielding electro-conductive metal film 210 and the common-mode choke coil 51. It is difficult to directly plate the core 52. Thus, the insulation film 211, which is a coating material such as a resin, is located on the surface of the core 52, and the surface is plated to obtain the shielding electro-conductive metal film 210. Also, the surface of the shielding electro-conductive metal film 210 is covered with an insulation film 212. More specifically, the windings 53*a* and 53*b*, which are conductive wires coated with insulation films, are further coated with the insulation films 211 and 212. This further improves insulation properties. The windings 53*a* and 53*b* having a multilayer insulation structure improves the quality. As described above, the windings 53*a* and 53*b* are wound around the core 52, the shielding electro-conductive metal film 210 is located on the core 52, around which the windings 53*a* and 53*b* are wound, with the insulation film 211 located in between, and the shielding electro-conductive metal film 210 is covered with the insulation film 212. As a result, the common-mode choke coil 51 is covered with a three-layer film of the insulation film 211, the shielding electro-conductive metal film 210, and the insulation film 212.

In the damping portion 80 of the first embodiment, as shown in FIGS. 2 and 3, the damping bottom portion 81 has the through holes 81*a* allowing for insertion of the terminals 61 to 64 so that the terminals 61 to 64 extend through the through holes 81*a*. Thus, the insulation needs to be ensured. In this regard, the second embodiment dispenses with through holes for terminal insertion.

The common-mode choke coil 51 may be entirely or partially covered with the shielding electro-conductive metal film 210. Covering at least a portion of the common-mode choke coil 51 allows a leakage flux to produce an eddy current. The shielding electro-conductive metal film 210 is not limited to a plating film and may be, for example, a metal film obtained through application or the like. The shielding electro-conductive metal film 210 only needs to be a non-magnetic film, and the material is not limited to copper. For example, the material may be aluminum. One of the insulation film 211 and the insulation film 212 may be omitted.

Third Embodiment

A third embodiment will now be described focusing on the differences from the first embodiment and the modified examples.

Figure 14:
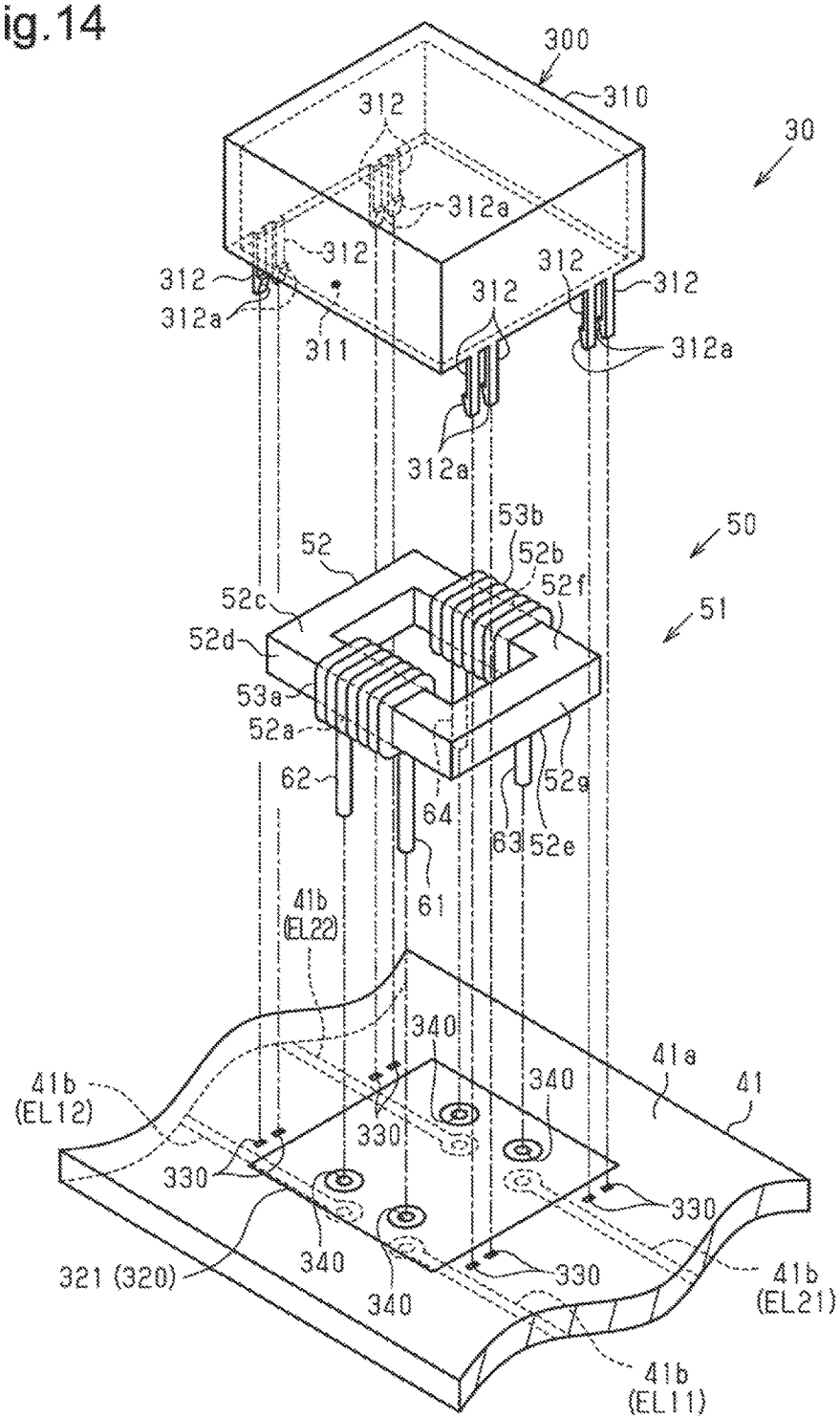
FIG. 14 is an exploded perspective view schematically showing a noise reducer in a third embodiment.
Figure 15:
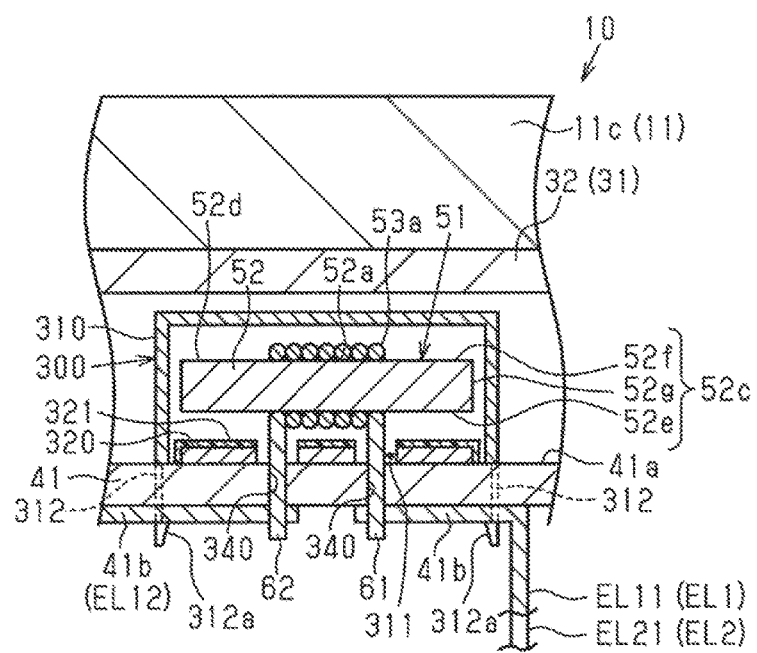
FIG. 15 is a cross-sectional view schematically showing the noise reducer of FIG. 14.

FIGS. 14 and 15 show a noise reducer (damping portion 300) of the third embodiment.

In the first embodiment, as shown in FIGS. 2 and 3, the common-mode choke coil 51 is accommodated in the accommodation space 83 defined by the damping portion 80, which is shaped as a box having the opening 80*a* and the bottom portion (wall end), and the inverter case 31 to lower the Q factor of the low-pass filter circuit 74. However, when the common-mode choke coil 51 is mounted on the circuit board 41, it may be difficult to cover the six sides of the common-mode choke coil 51 with metal.

In the third embodiment, one of the six sides of the common-mode choke coil 51 is covered with a pattern conductive body 320 (copper foil) of the circuit board 41, and the remaining five sides are covered with a shielding electro-conductive metal case 310 having an opening 311. More specifically, the inverter 30 includes the circuit board 41 including a pattern wire. The damping portion 300 includes the shielding electro-conductive metal case 310 and the shielding pattern conductive body 320. The shielding electro-conductive metal case 310, which accommodates the common-mode choke coil 51 from the opening 311, is fixed to the circuit board 41. The shielding pattern conductive body 320 is located on the circuit board 41 in a region inward from the opening 311 of the shielding electro-conductive metal case 310. This obtains the same advantage as when the six sides of the common-mode choke coil 51 are covered with metal. The pattern conductive body 320 may be a pattern conductive body originally included in the circuit board 41. Thus, the process for adding the damping portion 300 is partially omitted.

The detail will now be described below.

The shielding electro-conductive metal case 310 is shaped as a substantially rectangular box. The shielding electro-conductive metal case 310 is formed from copper, and the shielding electro-conductive metal case 310 is formed from a non-magnetic, electro-conductive material. The shielding electro-conductive metal case 310 accommodates the common-mode choke coil 51 from the opening 311 and is fixed to the circuit board 41 so that the opening 311 is closed by the circuit board 41. Attachment legs 312 extend straight toward the circuit board 41 from the edges of the opening 311 at multiple locations.

The shielding pattern conductive body 320 is arranged in a region of the circuit board 41 corresponding to the opening 311. The surface of the shielding pattern conductive body 320 is covered with an insulation film 321. The insulation film 321 is a resist film. The pattern wires 41*b* and the shielding pattern conductive body 320 are formed by copper foils. The pattern wires 41*b* and the shielding pattern conductive body 320 are formed from a non-magnetic, electro-conductive material. The circuit board 41 includes through holes 330 in positions corresponding to the attachment legs 312 of the shielding electro-conductive metal case 310. When the attachment legs 312 of the shielding electro-conductive metal case 310 are inserted into the through holes 330 of the circuit board 41, the shielding electro-conductive metal case 310 is attached to the circuit board 41. The attachment legs 312 have distal removal stoppers 312*a* (hooks), which prevents removal of the attachment legs 312 with the attachment legs 312 extending through the through holes 330.

The circuit board 41 includes through holes 340 in positions corresponding to the terminals 61 to 64 of the common-mode choke coil 51. The terminals 61 to 64 of the common-mode choke coil 51 are inserted into the through holes 340 of the circuit board 41. The distal ends of the terminals 61 to 64 project from the circuit board 41 and are soldered to the pattern wires 41*b*.

In the damping portion 80 of the first embodiment, as shown in FIGS. 2 and 3, the damping bottom portion 81 includes the through holes 81*a* allowing for insertion of the terminals 61 to 64. In the third embodiment, the terminals 61 to 64 extend through the opening 311 of the shielding electro-conductive metal case 310. Thus, the shielding electro-conductive metal case 310 does not need to include through holes for terminal insertion.

The shielding pattern conductive body 320 is not limited to a copper foil and may be, for example, a copper plating film.

The damping portion 300 located on the circuit board 41 only needs to be a shielding electro-conductive metal film and is not limited to the pattern conductive body 320. For example, a copper foil may be applied to the circuit board 41 as the shielding electro-conductive metal film. Further, an insulation film may be located between the copper foil and the circuit board 41.

The material of the damping portion 300, which is located on the circuit board 41, only needs to be a non-magnetic metal and is not limited to copper. For example, the material may be aluminum.

DESCRIPTION OF REFERENCE CHARACTERS 10) heatsink; 20) electric motor; 30) on-board inverter (on-board power conversion device); 31) inverter case (case); 41) circuit board; 41b) pattern wire; 42) power module (power conversion circuit); 50) noise reducer; 51) common-mode choke coil; 52) core; 52a) first core portion; 52b) second core portion; 52c) core surface; 52d) exposed portion; 52g) core peripheral surface; 53a, 110) first winding; 53b, 111) second winding; 71, 72) bypass capacitor; 73) smoothing capacitor; 74) low-pass filter circuit; 80, 130) damping portion; 80a) opening; 83) accommodation space; 103) PCU; 110a, 111a) high density portion; 110b, 111b) low density portion; 200) damping portion; 210) shielding electro-conductive metal film; 300) damping portion; 310) shielding electro-conductive metal case; 320) shielding pattern conductive body (shielding electro-conductive metal film); f0) resonance frequency of low-pass filter circuit; f1) carrier frequency; fc) cutoff frequency; Qu1 to Qw2) power module switching element

The invention claimed is:

1. An on-board power conversion device comprising:
    a power conversion circuit to which direct current power is input; and
    a noise reducer arranged at an input side of the power conversion circuit and configured to reduce common-mode noise and normal-mode noise contained in the direct current power before the direct current power is input to the power conversion circuit, wherein
    the noise reducer includes
        a common-mode choke coil including a core having a first core portion and a second core portion, a first winding wound around the first core portion, and a second winding wound around the second core portion and
        a smoothing capacitor cooperating with the common-mode choke coil to configure a low-pass filter circuit,
    the power conversion device further comprises a damping portion located at a position intersecting with a magnetic path of a leakage flux produced from the common-mode choke coil, and
    the damping portion is configured to produce an eddy current with the leakage flux to lower a Q factor of the low-pass filter circuit.

2. The on-board power conversion device according to claim 1, wherein the damping portion covers at least a portion of a side surface of the common-mode choke coil.

3. The on-board power conversion device according to claim 1, further comprising:
    a circuit board including a pattern wire; and
    a case accommodating the power conversion circuit, the circuit board, and the noise reducer, wherein
    the damping portion is shaped as a box having an opening covered by the case, and
    the common-mode choke coil is accommodated in an accommodation space defined by the dumping portion and the case.

4. The on-board power conversion device according to claim 1, wherein the damping portion includes a shielding electro-conductive metal film that covers at least a portion of the common-mode choke coil.

5. The on-board power conversion device according to claim 1, comprising a circuit board including a pattern wire, wherein the damping portion includes
    a shielding electro-conductive metal case having an opening, wherein the common-mode choke coil is accommodated in the shielding electro-conductive metal case through the opening, and the shielding electro-conductive metal case is fixed to the circuit board so that the opening is closed with the circuit board, and
    a shielding electro-conductive metal film located on the circuit board in a region inward from the opening.

6. The on-board power conversion device according to claim 5, wherein the shielding electro-conductive metal film is a shielding pattern conductive body.

7. The on-board power conversion device according to claim 1, wherein the damping portion is formed from a non-magnetic electro-conductive material.

8. The on-board power conversion device according to claim 1, wherein
    when a gain of the low-pass filter circuit with respect to normal-mode noise having a frequency conforming to a resonance frequency of the low-pass filter circuit equals an allowable gain that is set based on specifications of a vehicle, the low-pass filter circuit sets a specified Q factor, and
    the damping portion is configured so that a Q factor of the low-pass filter circuit is decreased to be lower than the specified Q factor.

* * * * *